United States Patent [19]
Iyer et al.

[11] Patent Number: 6,109,011
[45] Date of Patent: Aug. 29, 2000

[54] METHOD AND APPARATUS FOR CULTIVATION AND HARVESTING OF MUSHROOMS AND OTHER PLANT MATERIAL

[76] Inventors: Satish R. Iyer, 1632 Parker Avenue, Regina, Saskatchewan, Canada, S4S 4S1; Donald A. Goertzen, 35 Stern Bay, Regina, Saskatchewan, Canada, S4R 7T7

[21] Appl. No.: 09/112,250

[22] Filed: Jul. 8, 1998

[51] Int. Cl.[7] .................................................. A01G 1/04
[52] U.S. Cl. ................................................. 56/239; 47/1.1
[58] Field of Search ............................ 47/1.01 R, 1.1, 47/60, 820, 830, 30; 56/327.1, 328.1, 1, 239; 30/265

[56] References Cited

U.S. PATENT DOCUMENTS

| | | | |
|---|---|---|---|
| 3,286,398 | 11/1966 | Stengel | 47/1.1 |
| 3,511,032 | 5/1970 | Demuth | 56/1 X |
| 5,381,625 | 1/1995 | Wente | 47/83 |
| 5,590,489 | 1/1997 | Hattori et al. | 47/1.1 |

*Primary Examiner*—Robert E. Pezzuto
*Attorney, Agent, or Firm*—Craig J. Lervick; Oppenheimer Wolff & Donnelly LLP

[57] ABSTRACT

An apparatus for the controlled growth and harvesting of mushrooms and other plant material is disclosed comprising a substrate container including a growth surface through which extend a plurality of growth apertures arrayed in a pattern on the growth surface, and an exposure/cutting plate which is slidably mated to the growth surface. More than one growing surface could be used. The apparatus will allow for the significant reduction of labor and other costs associated with the production of mushrooms or other plant crops.

18 Claims, 10 Drawing Sheets

METHOD AND APPARATUS FOR CULTIVATION AND HARVESTING OF MUSHROOMS AND OTHER PLANT MATERIAL

This invention is in the field of the commercial cultivation of mushrooms and other plant material, and more particularly in the field of devices for the cultivation and harvest thereof.

BACKGROUND

Interestingly, even as people's appetite for pre-packaged and partially prepared convenience foods from their grocery stores for quick preparation in the home has increased, so has their appetite for more and more fresh produce. Producers of these prepared foods also require more inputs to prepare more product. Coupled with the increased popularity of ethnic foods, some of the fresh products which are in higher demand than ever before are mushrooms, as well as fresh herbs and other vegetables and fruits.

Many different processes are used in mushroom farming, each farmer in addition to the basic process employed having their own secrets which they use to peak the production from their facility. Regardless of methods used, however, mushroom farming as is currently practised is very labour intensive. The product itself requires careful attention, and for all of the technology involved in other farming industries today the harvesting of the mushroom crop is still primarily done manually. For example, where hanging plastic bags or other apparatus are used to grow the mushrooms, the mushrooms are often harvested by slicing them off of the outer surface of the bag or other apparatus by hand with a knife or other cutting tool. Another alternative, where large flat growing beds are employed, is for labourers to move over the bed and manually select and cut the produce which is ready for harvest. Various mechanisms have been conceived to assist in this regard. For example, one U.S. patent discloses a large moving platform which can be moved over the top of the growing bed and the labourers can kneel on top of this platform to thus get down over the growing bed without having to step therein. This allows for the use of bigger growing beds, but the additional apparatus costs more money and also provides a further source of potential contamination in the growing area.

There are mechanized methods of harvesting mushrooms, but they generally involve expensive technology also. For example, one U.S. patent discloses a cutting system mounted to move over a mushroom growing bed which has a video camera attached thereto. As the video camera passes over particular mushrooms growing in the growing bed, a computer interprets the video signal to decide if that mushroom is large enough for harvest. If so, it is cut and vacuumed out. While the problem of excessive manual labour requirements is reduced, technology such as this is prohibitively costly and with so many parts can create additional maintenance problems.

As well as being extremely labour intensive, the other inputs are costly also. For example, in many cases the growing beds or other growing apparatus are constantly reloaded with new substrate, and multiple crops are not always even harvested between such reloading. Also in some cases, the growing apparatus themselves are disposable after use, resulting in additional cost and more labour as they are changed.

The cost of all of the mushroom cultivation and harvesting processes currently employed in the art, along with the other measures which need to be taken in the production thereof, results in a relatively high overall cost and resultant price for mushrooms. The demand for mushrooms would potentially increase even further if the costs of production were altered such that the selling price of the product could be substantially dropped.

SUMMARY OF THE INVENTION

It is the object of the present invention to provide an apparatus allowing for the cultivation and harvesting of plant material such as mushrooms with minimal labour and economic inputs, and a method of use therefore.

It is the further object of the present invention to provide an apparatus for use in the cultivation and harvesting of plant material like mushrooms which device is reusable.

It is the further object of the present invention to provide an apparatus for use in the cultivation and harvesting of mushrooms which will allow for the selective multiple exposure of mushroom bodies growing in the apparatus, allowing for the repeated harvest of several crops of mushrooms from each growing mushroom body before the substrate and mushroom bodies are exhausted and need to be replaced.

It is the further object of the present invention to provide an apparatus and method for the growth of plant material, and particularly mushrooms, which apparatus and method will yield more produce from a device of similar or smaller size, and using less labour and physical supplies, than those methods and apparatus currently used in the field.

The invention accomplishes these objectives comprising substantially a cultivation and harvesting apparatus for use in the growth and harvesting of plant material, wherein said plant material is grown in a substrate before harvesting, said apparatus comprising a substrate container, said substrate container including a growth surface through which extend a plurality of growth apertures arrayed in a pattern on the growth surface; and an exposure plate which is slidably mated to the growth surface, said exposure plate having a plurality of exposure apertures passing therethrough and arrayed thereon in a pattern such that a portion of said exposure apertures align with a portion of said growth apertures wherein sliding the exposure plate with respect to the growth surface shears off the plant material by the misalignment of the mated growth apertures and exposure apertures.

While a first basic embodiment of the invention might have at least as many exposure apertures as growth apertures, wherein all of the growth apertures are thus aligned with a matching exposure aperture at the same time, and alternative embodiment of the device might have only a portion of the growth apertures in alignment within matching exposure apertures the same time, with the remaining growth apertures being covered by the exposure plate. This will allow for the selective multiple exposure of subsets of the growth apertures and the plant matter growing therethrough.

Either of these basic embodiments could be configured in various shapes. An advantageous configuration of the product for manual use is as a columnar set wherein the substrate container comprises a substrate column, the growth surface being the outer surface of the substrate column and through which the growth apertures pass, and the exposure plate comprises an exposure column of approximately the same inside dimension as the outside dimension of the substrate column, wherein the exposure plate can be slid along the growth surface by sliding the substrate column and the exposure column against each other. Wherein cylindrical columns were employed, the substrate column and the exposure column could be rotated against each other rather than slid up and down.

An alternative to the cylindrical configuration would be in a number of flat shapes. For example, where the growth surface and the exposure plate are flat, the exposure plate can be slid back and forth across the growth surface. Alternatively, where the growth surface and the exposure plate are flat and circular, the exposure plate can be slid along the growth surface by rotating it.

The exposure apertures could be sharpened to maximize their cutting efficiency. The exposure apertures could be sharpened either by physically sharpening their edges, or by changing the shape of the corresponding growth apertures and exposure apertures so as to create an improved shearing movement as the exposure plate is moved against the growth surface and the corresponding sets of apertures are misaligned.

A handle could be added to the exposure plate to simplify the manual operation of the device. The handle might be removable in order to store more of the apparatus in a smaller area. The movement of the exposure plate could also be mechanized—large embodiments of the invention could be produced in this manner.

The efficiency of the device could be further improved by lessening the amount of substrate required in the device to grow the plant crop. Particularly, a volume-reducing core could be added to the substrate container such that the central area of the substrate container, which would normally contain substrate not required in the growth of plant material around the periphery of the container, would be filled by a core, either solid or hollow, which has the effect of reducing the overall volume of the substrate container and still leaving space for required substrate near the outside of the container. Significant cost savings could be realized by this addition, since only the amount of substrate really required for the growth of a crop of plant material in the substrate container would be used, and excess substrate would not be contained in the central area of the container which would not be used and which subsequently be discarded along with the spent substrate from around the periphery of the container.

The concept of the volume-reducing core could be taken one step further, to provide for a second growth surface in the device. Particularly, the volume-reducing core could be made hollow and would form an internal growth surface through which could extend a plurality of internal growth apertures arrayed in a pattern on said internal growth surface. This most basic embodiment of the internal growth surface would allow for the growth of plant material "out of both sides" of the same quantity of substrate contained within the substrate container, and the plant material growing on the internal growth surface could then be harvested using either a knife or some other conventional cutting implement.

The concept of the volume-reducing core as an internal growth surface could be taken one step further by the addition of a second exposure plate, which second exposure plate would be slidably mated to the internal growth surface and would have a plurality of second exposure apertures passing therethrough and arrayed thereon in a pattern such that the second exposure apertures would align with a portion of the internal growth apertures, and wherein sliding the second exposure plate with respect to the internal growth surface would shear off the plant material growing therethrough by the misalignment of the mated internal growth apertures and second exposure apertures. This will allow for the basic mechanical harvesting of plant material from both the outside and inside of the substrate container.

As in the case of the basic embodiment of the present invention without the addition of the volume-reducing core, this embodiment of the device including the internal growth surface and the second exposure plate might either be configured such that all of the internal growth apertures were aligned with a second exposure aperture at the same time, or might alternatively be designed such that only a portion of the internal growth apertures are aligned with a matching second exposure aperture at the same time, the remaining internal growth apertures being covered by the second exposure plate.

As in the case of the growth apertures and the exposure apertures, the second exposure apertures and the internal growth apertures might be sharpened in order to facilitate the harvesting of the plant material. As with the movement of the exposure plate in relation to the growth surface, the movement of the second exposure plate with respect to the internal growth surface could be mechanized.

The exposure plate and the second exposure plate might either operate independently from one another or might be joined, alternatively, such that the same harvesting motion would move both exposure plates at the same time.

Another basic embodiment of the invention is a simple cutting embodiment. This would comprise substantially a substrate container, said substrate container including a growth surface through which extend a plurality of growth apertures arrayed in a pattern on the growth surface; and a cutting plate which is slidably mated to the growth surface.

Again a cylindrical configuration is particularly contemplated, wherein the substrate container comprises a substrate column, the growth surface being the outer surface of the substrate column and through which the growth apertures pass, and the cutting plate comprises a cutting column of approximately the same inside dimension as the outside dimension of the substrate column, wherein the cutting plate can be slid along the growth surface by pushing it down along the length of the substrate column, mushrooms or other plant material being sheared off and falling off of the growth surface as the cutting column is pushed down.

This cutting embodiment could also be practiced in a flat configuration wherein the growth surface and the cutting plate are flat and rectangular, and wherein the cutting plate can be slid back and forth along one dimension of the rectangle across the growth surface.

The operation of the cutting embodiment might also be improved by sharpening the cutting plate.

The cutting embodiment could also be configured with the inclusion of a volume-reducing core in the substrate container. Again, the volume-reducing core might be hollow and have a plurality of internal growth apertures added thereto and might thereby form an internal growth surface. A second cutting plate could be configured to slidably mate with the internal growth surface and allow for the harvesting of plant material growing therethrough.

The cutting plate and the second cutting plate might operate independently from each other, or might be joined such that the same motion would move them both.

The second cutting plate might also be sharpened.

Again a handle could be added to simplify the manual operation of the device, or mechanical movement means could be added to drive the cutting plate and/or the second cutting plate.

The plant material grown could be mushrooms, leafy plants or other plant material. In the case of mushrooms, the substrate used would be conventional mushroom growing substrate as is known in the art. In other cases, soil or other substrates could be employed.

The present invention also comprises a novel method for the growth and cultivation of mushrooms, leafy plants or other plant material. The basic method of the present invention comprises substantially placing a substrate in apparatus for the growth and harvesting of plant material, said apparatus comprising a substrate container, said substrate container in turn including a growth surface through which extend a plurality of growth apertures arrayed in a pattern on the growth surface; and an exposure plate which is slidably mated to the growth surface, said exposure plate having a plurality of exposure apertures passing therethrough and arrayed thereon in a pattern matching the pattern of the growth apertures on the growth surface. The growth apertures and the exposure apertures of the apparatus would be aligned such that the substrate within the substrate container is accessible to outside of the exposure plate, and that plants growing in the substrate can grow through the growth surface and the exposure plate via the aligned growth apertures and exposure apertures. Plant material is planted in the substrate within the substrate container while the growth apertures and the exposure apertures are in alignment such that the plants when they germinate will grow out of the substrate container through the aligned aperture sets.

Once the plant material planted in the substrate has been allowed to grow to the desired stage, the plant material can be harvested by sliding the exposure plate along the growth surface, the misalignment of the growth apertures and exposure apertures in the process shearing off the plant material.

The apparatus of this method might be manufactured such that all of the growth apertures are aligned with a matching exposure aperture at the same time, thus allowing for a full growth and cultivation of plant material in the apparatus. Alternatively, only a portion of the growth apertures might be aligned with a matching exposure aperture at the same time, with the remaining growth apertures being covered by the exposure plate—this will allow for the selective multiple exposure of subsets of the growth apertures.

The apparatus of this method might be modified also to add a means of mechanically moving the exposure plate in relation to the growth surface.

Following the harvesting of the plant material, the growth apertures and the exposure apertures might be re-aligned, thus allowing for the production of additional crop from the existing substrate and plant material planted within the apparatus. The growth and harvesting cycle of the method could be performed more than once with the same substrate and plant material in the substrate container before the container needed to be emptied and reloaded.

The apparatus of the method of the present invention might also be improved by the addition of a volume-reducing core to the substrate container which would have the benefit of reducing the amount of substrate required, and the amount of substrate wasted, in the growth of each crop of plant material. The volume-reducing core could also be converted into an internal growth surface by making it hollow and arraying a plurality of internal growth apertures thereon, facing towards the center of the substrate container. A second exposure plate might also be added, as discussed in detail with respect to the particulars of the apparatus of the present invention, in order to simplify the harvesting of plant material growing on the internal growth surface.

To summarize yet another novel method of the present invention, plant material might be grown and harvested by a method comprising substantially the placement of a substrate in apparatus for the growth and harvesting of plant material, said apparatus comprising a substrate container, said substrate container including a growth surface through which extends a plurality of growth apertures arrayed in a pattern on the growth surface; and a cutting plate which is slidably mated to the growth surface. Plant material could be planted in the substrate within the substrate container such that the plants when they germinate will grow out of the substrate container through the growth apertures. Once the plant material has been allowed to grow to the desired stage, the plant material can be harvested by sliding the cutting plate along the growth surface, thus shearing off the plant material.

This method employing the cutting plate could be improved by sharpening the cutting plate to facilitate the shearing off of the plant material by the sliding of the cutting plate across the growth surface. This method might also be improved or modified by adding a means of mechanical movement of the cutting plate in relation to the growth surface to the apparatus thereof.

Again, this growth in harvesting cycle could be performed more than once with the same substrate and plant material in the substrate container before the substrate container was emptied and reloaded.

Again this method of the present invention employing the cutting plate in the place of exposure plate could be altered and improved further by adding a volume-reducing core to the substrate container. By making the volume-reducing core hollow and adding a series of internal growth apertures thereto, the core could be converted into an internal growth surface on which a second cutting plate might be employed.

DESCRIPTION OF THE DRAWINGS

While the invention is claimed in the concluding portions hereof, preferred embodiments are provided in the accompanying detailed description which may be best understood in conjunction with the accompanying diagrams where like parts in each of the several diagrams are labeled with like numbers, and where:

DETAILED DESCRIPTION OF THE ILLUSTRATED EMBODIMENTS

Before describing the various embodiments of the present invention in detail, it is desired to clarify the types of plant material with which the present invention could be used. The device, and method of use therefore, of the present invention is specifically intended for use with mushroom growing. It is also foreseeable however that it could be used in the growth of other plant crops including leafy plants, cut flowers or other commercially produced crops. It will be understood that any reference herein to a mushroom crop, or other more generic reference to plant material cultivated and harvested in the device, could be interchangeably substituted with another plant crop. It will be understood that the cultivation or harvesting of any other plant crop other than mushrooms using the apparatus or method of the present invention, are contemplated within the scope of the present invention.

Mushroom spores are inoculated into the substrate in which they can grow. Once the mushroom bodies have grown in the substrate to a commercially salable size, they are harvested by a number of conventional methods which include simply cutting them off with a knife or picking them. Generally speaking, the substrate is then discarded and a fresh batch prepared in the growth vessel which is in turn inoculated with a new batch of mushroom spores and a next batch of mushroom bodies produced. The device of the present invention will allow for the harvesting of plant material growing in the device by a simple manual movement of one part of the device. Labor savings will be significant. In addition, the relative simplicity and low-cost production of the device will provide economic savings as well. As will also be described in further detail below, the device has the potential of allowing for the multiple exposure and multiple use of the same batch of mushroom growing substrate, and mushroom spores. A multiple exposure apparatus such as this will further lower the cost of production of mushrooms because less substrate and spores will be required.

Figure 1:
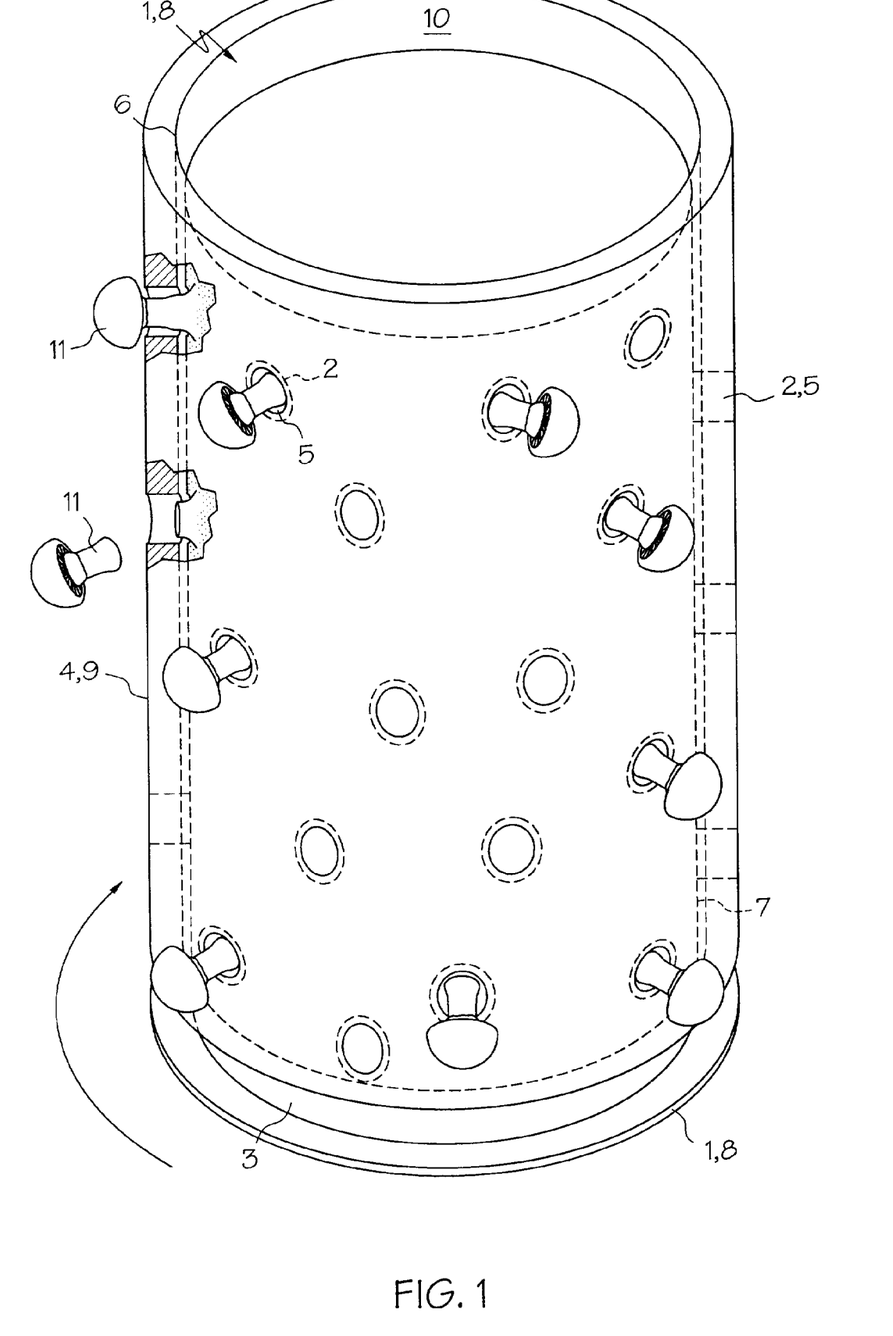
FIG. 1 is a perspective view of one embodiment of the present invention wherein the substrate container and the exposure plate are mating cylindrical columns, wherein all of the growth apertures are aligned with a matching exposure aperture at the same time.

To look then at the basic embodiments of the present invention. FIG. 1 is a perspective view of one embodiment of the present invention wherein the substrate container 1 and the exposure plate 4 are mating cylindrical columns, wherein all of the growth apertures 2 are aligned with a matching exposure aperture 5 at the same time. The substrate container 1 comprises a substrate column 8 with a number of growth apertures 2 passing through the other surface thereof, which is the growth surface 3. The exposure plate 4 of this embodiment is an exposure column 9. The exposure column 9 in this embodiment is of approximately the same inside dimension 6 as the outside dimension 7 of the substrate column 8, wherein the exposure plate 4 can be slid along the growth surface 3 by rotating the substrate column 8 and the exposure column 9 against each other.

In the operation of such a columnar configuration of the device, substrate 10 could be placed within the substrate column 8 and the mushroom spores inoculated into the substrate through the growth apertures 2. Mushroom bodies 11 could then grow within the substrate 10 in the substrate column 8, out of the growth apertures 2, and further out through the exposure plate 4 through the exposure apertures 5 which could be aligned with the growth apertures 2. At such point in time as it was desired to harvest the mushroom bodies 11 growing in the device, the exposure column 9 could be rotated against the substrate column 8, the mushroom bodies 11 growing therefrom being cut off by the closing movements of the growth apertures 2 and the exposure apertures 5 as they came out of alignment.

We speak of the exposure plate 4 being slidably mated to the growth surface 3. The method of slidable attachment of the exposure plate 4 to the growth surface 3 might be such that the exposure plate 4 and the substrate container 1 were permanently attached, or it might alternatively be such that the exposure plate 4 and the substrate container 1 were removable from one another. For example, in the case of the columnar configuration of circular cross-section discussed and demonstrated in FIG. 1, the exposure column 9 might be actually permanently attached to the substrate column 8 in such a manner that the two columns 8,9 could be rotated against one another without any sliding up or down along the axis of the columns. Alternatively, in a columnar configuration of different cross-section, where an up and down harvesting motion was required rather than a rotational harvesting motion, the substrate column 8 would need to slide up and down within the exposure column 9, along the axis of the two columns and as such it might in that situation be easier to make the exposure column 9 removable from the substrate container 1. It will be understood that either such configuration of the slidable mating of the exposure plate 4 and the growth surface 3, namely whether the two of them are permanently attached or not, is contemplated within the scope of the present invention. The key to the success of the harvesting movement of the exposure plate 4 against the growth surface 3 is that of the close conformity of the exposure plate 4 to the growth surface 3.

The demonstrated columnar configuration is circular in cross-section. It will be understood that similar effect could be achieved using a columnar configuration with a different cross-sectional shape, with potential changes in the harvesting movement necessitated thereby. For example, if a columnar configuration with a rectangular or triangular cross-section were used, the movement of the exposure column 9 might need to be changed from a rotational movement about the outside of the substrate column 8 to an up and down movement, which would have the same shearing effect on mushroom bodies or other plant material 11 growing out through the aligned apertures 2,5 as the growth apertures 2 and the exposure apertures 5 were taken out of alignment with each other. It will be understood that such changes in the cross-sectional shape of the columnar configuration, and the changes to the shearing motion necessitated thereby, are contemplated within the scope of the claimed invention.

Figure 2:
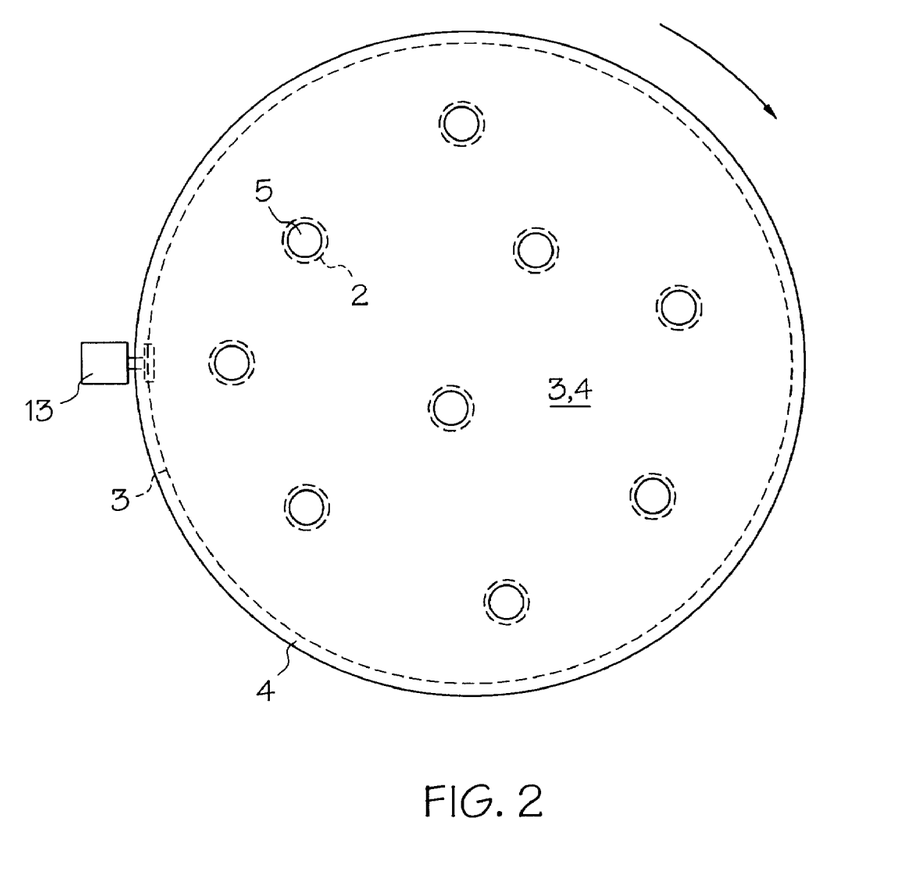
FIG. 2 is a top view of another embodiment of the present invention wherein the growth surface and the exposure plate are flat and circular and wherein all of the growth apertures are aligned with a matching exposure aperture at the same time, and also demonstrating the addition of means of mechanical movement of the exposure plate in relation to the growth surface.
Figure 3:
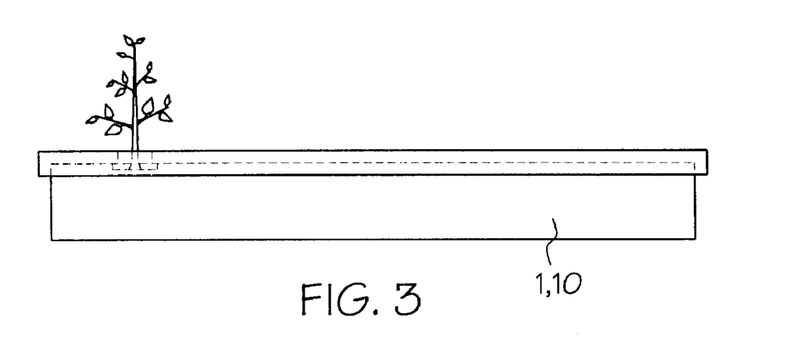
FIG. 3 is a side view of the embodiment of FIG. 2.

FIG. 2 is a top view of another embodiment of the present invention wherein the growth surface 3 and the exposure plate 4 are flat and circular and wherein all of the growth apertures 2 are aligned with a matching exposure aperture 5 at the same time, and also demonstrating the addition of means of mechanical movement 13 of the exposure plate in relation to the growth surface. The substrate container 1 is circular, or at least the portion of the substrate container 1 making up the growth surface 3 and upon which the growth apertures 2 are arrayed is circular, and the exposure plate 4 is also circular and has approximately the same dimension as the substrate container 1. Again, whether it be by permanent attachment or setting the exposure plate 4 in place before the growth of the plant material 11 in the substrate 10, the plant material 11 could be harvested using a simple harvesting motion. In the case of this circular embodiment the harvesting motion could be to rotate the exposure plate 4 on top of the growth surface 3, rather than to slide it along one vector. This flat circular embodiment would again lend itself to manufacture in large dimension also.

A number of different methods likely exist for applying power to the harvesting motion of the exposure plate 4. For example, the embodiment of FIG. 2 shows a motor 13 attached in such a manner as to rotate the exposure plate 4 upon actuation of the motor. It will be understood that various methods of mechanized motion of the exposure plate 4 over the growth surface 3 exist and that all such methods are contemplated within the scope of the present invention.

Figure 4:
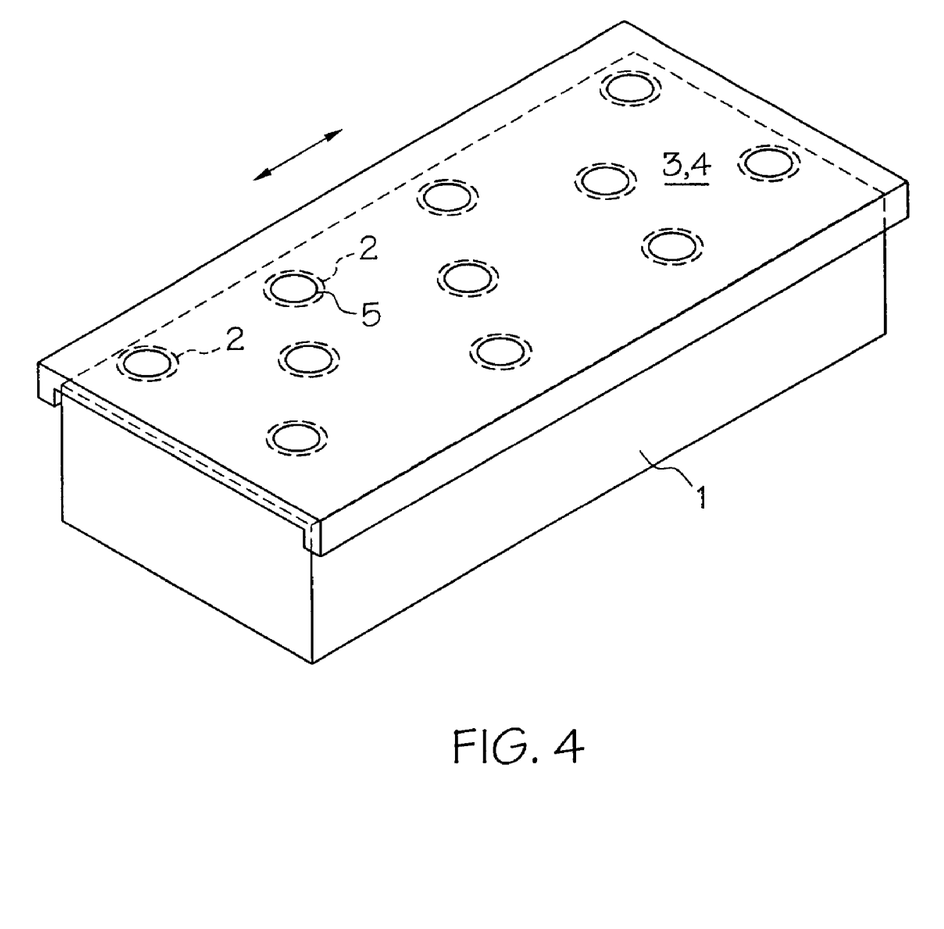
FIG. 4 demonstrates an embodiment of the present invention wherein the growth surface and the exposure plate are flat and rectangular, and wherein only a portion of the growth apertures are aligned with a matching exposure aperture at the same time, the remaining growth apertures being covered by the exposure plate.

FIG. 4 demonstrates an embodiment of the present invention wherein the growth surface 3 and the exposure plate 4 are flat and rectangular, and wherein only a portion of the growth apertures 2 are aligned with a matching exposure aperture 5 at the same time, the remaining growth apertures 2 being covered by the exposure plate 4. The substrate container 1 is a flat rectangular bed containing the substrate 10. The growth surface 3 is in effect a cover extending over top of this flat rectangular bed, with a plurality of growth apertures 2 arrayed in a pattern thereon. In some ways this particular embodiment is similar in appearance to a conventional mushroom growing bed, with the exception of the growth surface 3. Next there is shown an exposure plate 4 which is slidably mounted to the growth surface 3 such that it will slide back and forth along one dimension of the rectangle, said direction being demonstrated in FIG. 10. As with the columnar configurations discussed above, the exposure plate 4 and the growth surface 3 could be permanently mounted together, or the exposure plate 4 could be made removable from the growth surface 3 to allow for easier cleaning and the like. In the use of such a flat rectangular embodiment, mushroom bodies or other plant material 11 growing up through the aligned growth and exposure apertures 2,5 could be harvested by simply sliding the exposure plate 4 along the growth surface 3, shearing off the plant material for collection. This would be of particular assistance in the situation of a very large embodiment of this device being built in accordance with this configuration.

FIG. 4 also demonstrates an additional aspect of the present invention which allows for the selective multiple exposure of subsets of the growth apertures and consequently the mushroom bodies or plant material growing therein. There is shown in that embodiment an apparatus for use in the growth and harvesting of plant material, wherein said plant material is grown in a substrate before harvesting, the apparatus itself comprising a substrate container 1, said substrate container including a growth surface 3 through which extend a plurality of growth apertures 2 arrayed in a pattern on the growth surface 3; and an exposure plate 4 which is slidably mated to the growth surface 3, said exposure plate 4 having a plurality of exposure apertures 5 passing their through, to the number of exposure apertures 5 being less than number of growth apertures 2, and whereby the exposure apertures 5 are arranged on the exposure plate 4 such that consecutive subsets of the growth apertures 2 are aligned with the exposure apertures 5 as the exposure plate 4 is moved. An embodiment of this type will allow for only a selective subgroup of the growth apertures 2 and the plant material growing therein to be exposed at any one time, via alignment with the exposure apertures 5. In the case of mushroom cultivation, this will allow a group of mushroom bodies to be harvested by cutting them off at the intersection of the growth apertures 2 and the exposure apertures 5—the portions of the mushroom bodies then remaining within the substrate container 1 will be sealed off from the air and the environment and another set of growth apertures 2 coming into alignment with the exposure apertures 5, thus allowing another group of mushroom bodies to grow up to therefrom. The portions of the mushroom bodies remaining sealed off within the substrate container will have an opportunity to rest, and would then be exposed again to the environment in the future as the exposure plate is moved again. In this manner, the substrate and the mushroom bodies inoculated therein might be allowed to yield multiple batches of fruit, until the nutrient levels in the substrate are depleted to the point that the device needs to be reloaded. This multiple exposure aspect of the device is another cost-saving and labor saving improvement over the devices in the prior art.

The key to a successful multiple exposure device of this nature would be to ensure the proper placement of the growth apertures 2 on the growth surface 3, as well as the exposure apertures 5 on the exposure plate 4, so as to ensure the proper alignment of subsets of the apertures 2, 5 with each other as the exposure plate 4 is moved/rotated/slid across the growth surface 3.

The efficiency of the device could be further improved by lessening the amount of substrate required in the device to grow the plant crop. This could be done by the addition of a volume-reducing core to the substrate container, as demonstrated in FIG. 5, such that the central area of the substrate container 1, which would normally contain substrate not required in the growth of plant material around the periphery of the container 1, would be filled by a core which has the effect of reducing the overall volume of the substrate container and still leaving space for required substrate near the outside of the container. The volume-reducing core 16 is demonstrated in this Figure attached in the center of a columnar embodiment of the device, leaving a smaller open space within the substrate container 1 within which the substrate can be placed and the plant material grown. Significant cost savings could be realized by this addition, since only the amount of substrate actually required for the growth of a crop of plant material in the substrate container would be used, and excess substrate would not be contained in the central area of the container which would not be used and which would subsequently be discarded along with the spent substrate from around the periphery of the container. In the case of this embodiment, the core 16 is closed. It might either be hollow or solid, and the ends need not be closed, in order for the core 16 to accomplish its objective of reducing the internal volume of the substrate container 1. The core 16 could be suspended within the substrate container 1 in any number of manners, and it will be understood that, the method of attachment not being an essential element of the operation of the core 16, any such method of attachment is contemplated within the scope of the present invention. Similarly, whether the core 16 is hollow or solid, closed or open on the ends, so long as it accomplishes its objective of reducing the internal volume of the substrate container, are not important requirements of the present invention again and of themselves, and as such any variations thereon also will be contemplated within this scope of the present invention and understood by a person skilled in the art.

Figure 5:
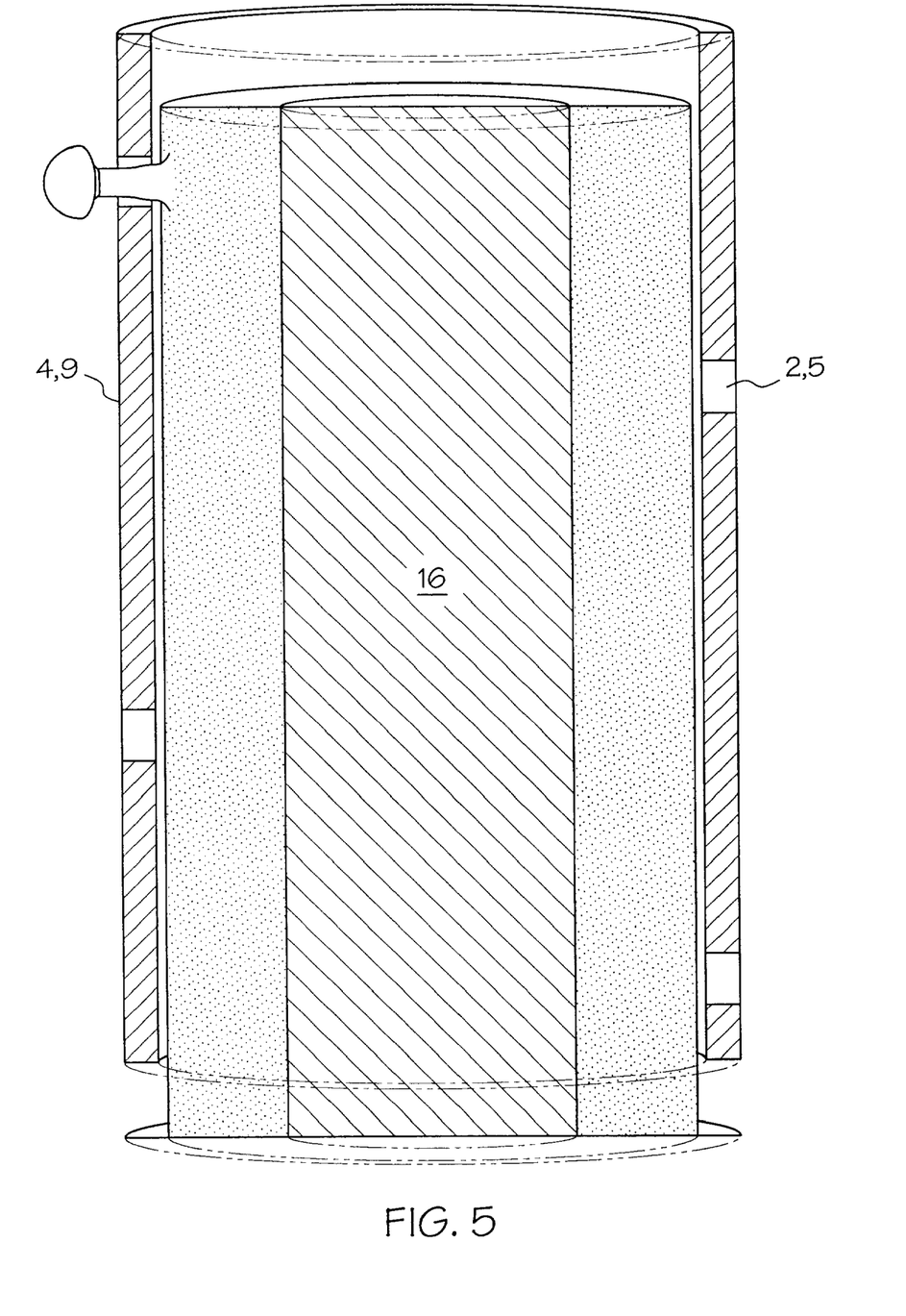
FIG. 5 shows an embodiment of the present invention based on the embodiment of FIG. 1, the columnar embodiment, wherein the substrate container also includes a volume-reducing core.
Figure 6:
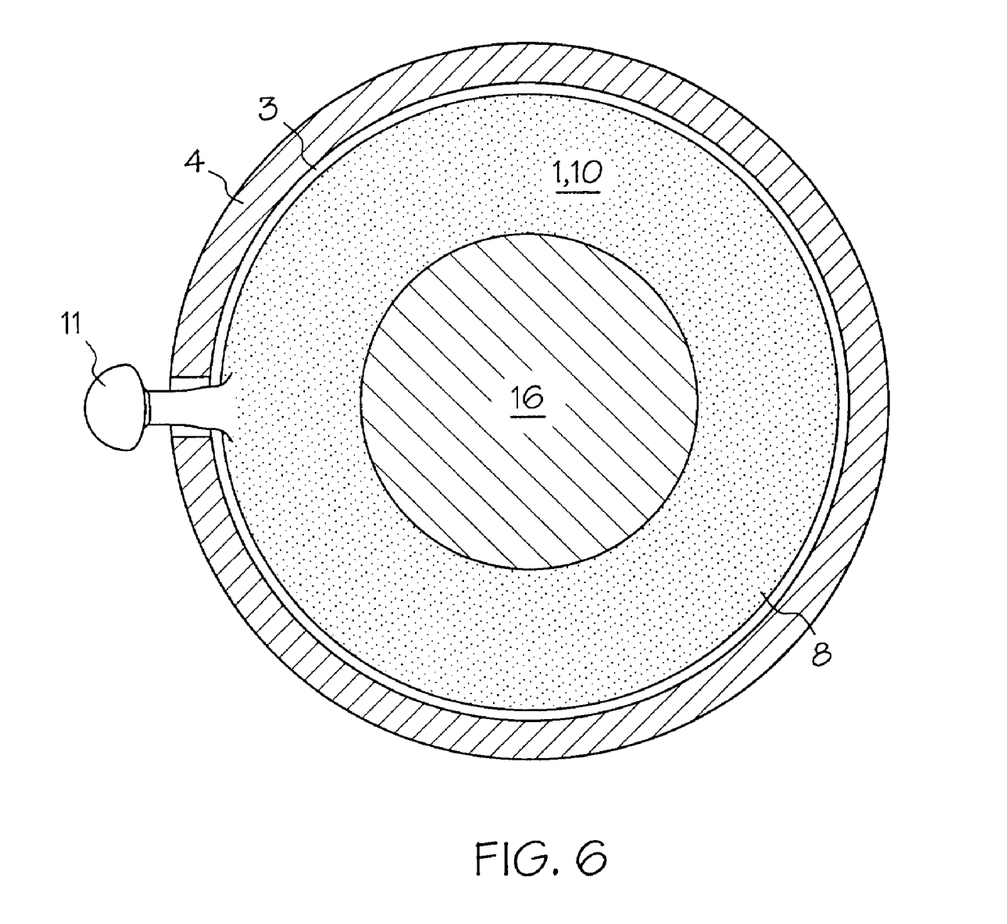
FIG. 6 is a top view of the embodiment of FIG. 5.

FIG. 6 is a top view of the embodiment of FIG. 5, and shows from a different perspective of the beneficial reduction of the internal volume of the substrate container 1 by the addition of the volume-reducing core 16.

Figure 7:
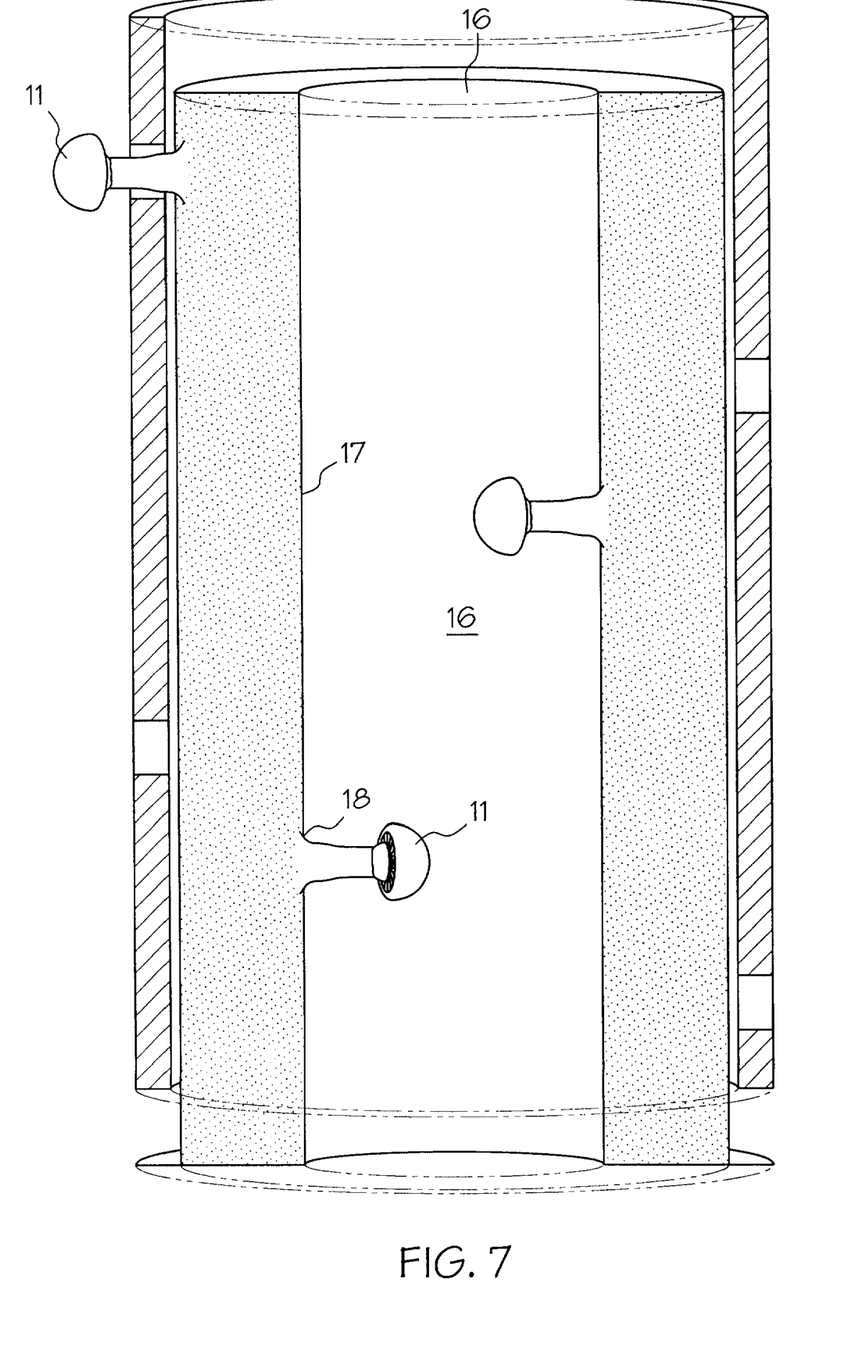
FIG. 7 is a perspective view of a further improvement on the embodiment of FIGS. 5 and 6, whereby the volume-reducing core includes a plurality of internal growth apertures, and forms an internal growth surface.
Figure 8:
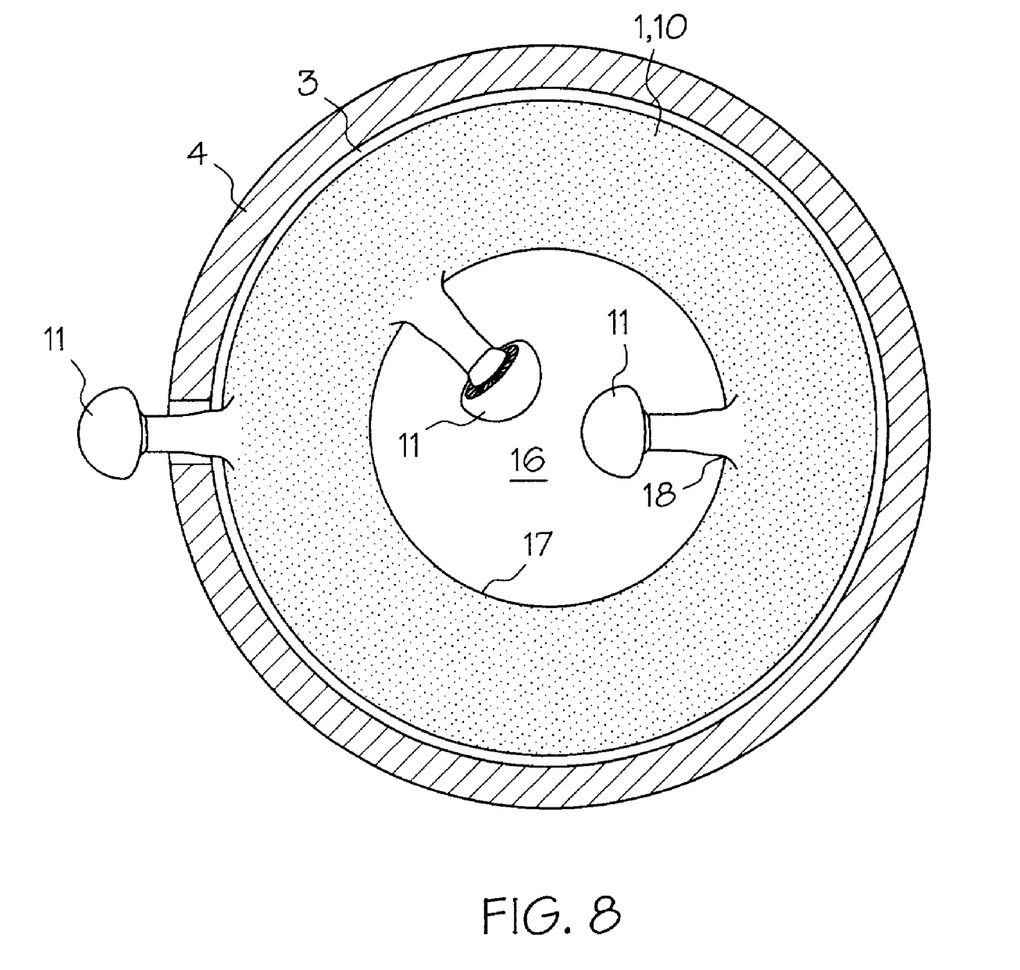
FIG. 8 is a top view of the embodiment of FIG. 7, demonstrating the growth of plant material on both the growth surface and the internal growth surface of the device.

Even further savings and productivity can be wrought from this device incorporating the volume-reducing core 16, by converting said core 16 into a second growth surface. The volume-reducing core 16 can be converted into an internal growth surface 17 by using a hollow core 16 and providing a set of internal growth apertures 18 which open towards the center of the substrate container 1. This provides a second surface on which plant material can be cultivated within the reduced amount of substrate required in the container 1 including the core 16. Plant material 11 can then grow both away from the substrate container 1 through the growth apertures 2 arrayed on the outside of the substrate container 1, as well as towards the center of the substrate container 1 by growing through the internal growth apertures 18 on the internal growth surface 17. This most basic embodiment of the internal growth surface would allow for the growth of plant material "out of both sides" of the same quantity of substrate contained within the substrate container, and the plant material growing on the internal growth surface could then be harvested using either a knife or some other conventional cutting implement. FIG. 8 demonstrates this growth of plant material out of both sets of growth apertures.

In the device of FIGS. 7 and 8, plant material growing out of the internal growth apertures could be harvested using a knife or some other conventional method. The alternative to the use of a conventional knife or other harvesting implement to harvest plant material from the internal growth surface is to add a second exposure plate to the device. In this regard we refer to FIG. 9.

Figure 9:
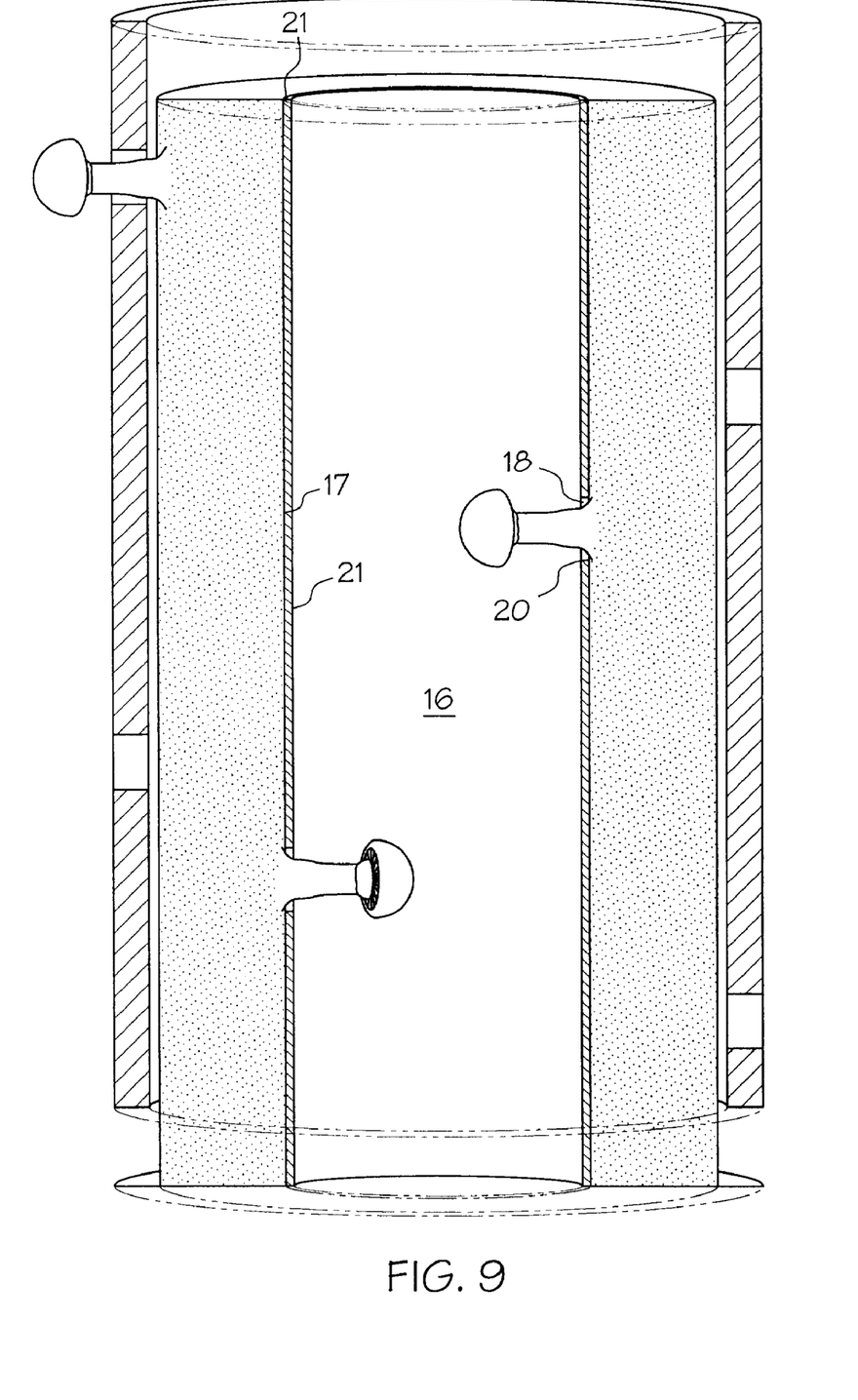
FIG. 9 demonstrates the embodiment of FIGS. 7 and 8 with the addition of a second exposure plate.

FIG. 9 demonstrates the addition of a second exposure plate to the device of FIGS. 7 and 8, which second exposure plate 19 is slidably mated to the internal growth surface 17 and has a plurality of second exposure apertures 20 passing therethrough and arrayed thereon in a pattern such that the second exposure apertures 20 would align with a portion of the internal growth apertures 18, and wherein sliding the second exposure plate 19 with respect to the internal growth surface 17 would shear off the plant material growing therethrough by the misalignment of the mated internal growth apertures 18 and second exposure apertures 20. This will allow for the basic mechanical harvesting of plant material from both the outside and inside of the substrate container 1.

In this Figure, each internal growth aperture 18 is demonstrated with a mating second exposure aperture 20. All of the internal growth apertures 18 might be aligned with a second exposure aperture 20 at the same time, or the device might alternatively be designed such that only a portion of the internal growth apertures 18 are aligned with a matching second exposure aperture 20 at the same time, the remaining internal growth apertures 18 being covered by the second exposure plate 19. It will be understood that both such configurations of the internal growth apertures and second exposure apertures are contemplated within the scope of the present invention.

As in the case of the growth apertures 2 and the exposure apertures 5, the second exposure apertures 20 and the internal growth apertures 18 might be sharpened in order to facilitate the harvesting of the plant material. As with the movement of the exposure plate 4 in relation to the growth surface 3, the movement of the second exposure plate 20 with respect to the internal growth surface 18 could be mechanized.

The exposure plate 4 and the second exposure plate 20 might either operate independently from one another or might be joined, alternatively, such that the same harvesting motion would move both exposure plates at the same time.

It will be understood by one skilled in the art that while the addition of the volume-reducing core 16 has been demonstrated in FIGS. 5 to 9 on columnar embodiments of the invention, that the addition of a volume-reducing core 16, and/or the conversion of the core 16 to an internal growth surface 17, and/or the addition of a second exposure plate 19, could all, with various modifications be practiced on embodiments of the invention of different shapes and sizes and that the application of these concepts to embodiments of a cultivation and harvesting device of different shapes and sizes is contemplated within the scope of the present invention.

Figure 10:
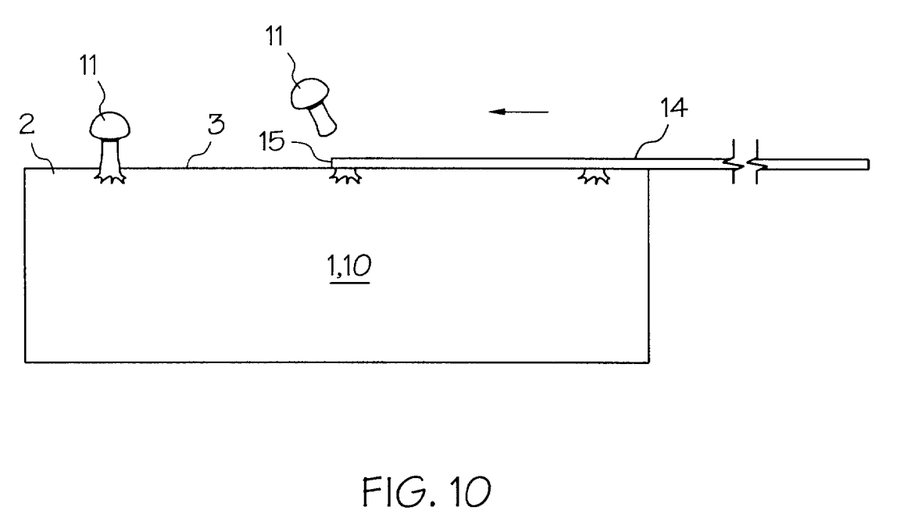
FIG. 10 demonstrates yet another embodiment of the present invention with a cutting plate, rather than an exposure plate, the cutting plate and the growth surface being rectangular and flat.

FIG. 10 demonstrates yet another embodiment of the present invention with a cutting plate 14, rather than an exposure plate, the cutting plate 14 and the growth surface 3 being rectangular and flat. Shown therein again is an apparatus for use in the growth and harvesting of plant material, said apparatus comprising a substrate container 1 which includes a growth surface 3 through which extend a number of growth apertures 2, and a cutting plate 14 which is slidably mated to the growth surface 14. The cutting plate 14, unlike the exposure plate 4 of the previously discussed embodiments, does not bear any exposure apertures 5. Rather, with a sharpened leading edge 15, the cutting plate 14 can be used to share off the mushroom bodies or other plant material growing out through the growth apertures 2. The cutting plate 14 can then the removed or slid back from its position covering the growth surface 3 to allow the plant material or mushroom bodies growing in the substrate container 1 to continue or regenerate their growth. If it was desired to provide a period of rest for the mushroom bodies or other plant material growing in the substrate container 1, the cutting plate 14 could be also used as a cover over the growth surface 3 and then removed at a later time.

While the embodiment demonstrated in FIG. 10 shows the use of the cutting plate 14 on a flat, rectangular device, it will be understood that the cutting plate concept could also be employed in devices of other shapes and sizes. For example, the columnar configurations discussed throughout this specification could use a cutting column, rather than exposure column, which could be lowered down or pushed down from the top of the substrate column to shear off the mushrooms or other plant material growing out of the growth apertures 2. It will be understood that the use of this cutting plate concept on embodiments of a similar device, other than the flat rectangular device specifically disclosed in FIG. 8, are contemplated within the scope of the present invention as well.

Figure 11:
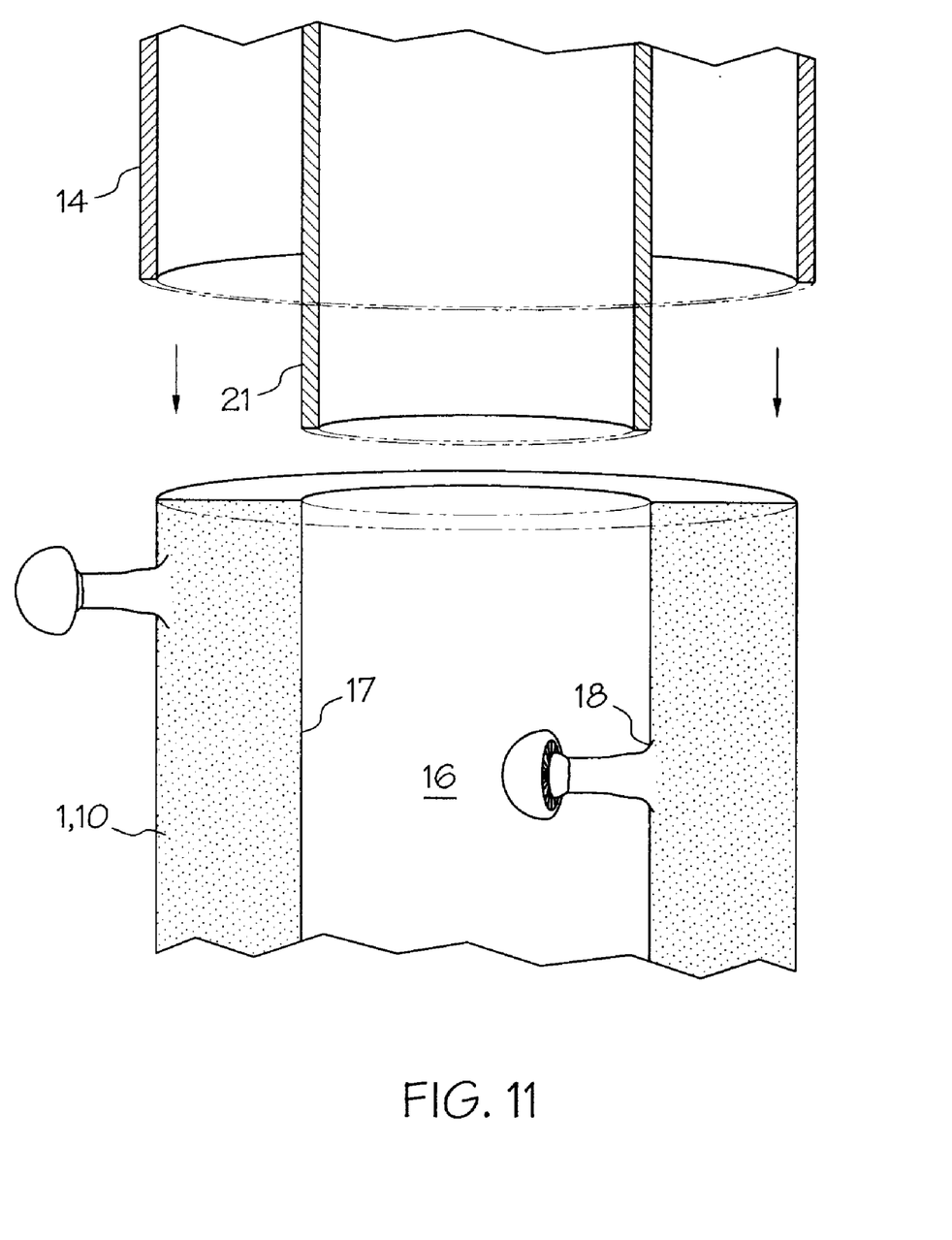
FIG. 11 demonstrates a columnar embodiment of the cutting plate configuration of the present invention, also showing a volume-reducing core in the substrate container, the cutting plate and the second cutting plate being joined together and being shown in disassembled view.

FIG. 11 shows a columnar embodiment of the cutting design of the present device of FIG. 10, with the addition of a volume-reducing core 16 inside of the substrate container 1. The core 16 has been converted into an internal growth surface 17, with a number of internal growth apertures 18 extending therethrough. A second cutting plate 21 has been added which can be used to shear off plant material growing from the internal growth apertures 18 of this embodiment. The cutting plate 14 and the second cutting plate 21 in this particular embodiment are shown joined together such that one movement would provide the cutting motion for both of the cutting plates 14, 21 at the same time. Again, it will be understood that the use of a core 16 on a cutting embodiment of the invention as shown in this Figure upon a columnar embodiment could also be practiced on embodiments of the invention of other shapes and sizes. The use of such a technique in the production of a device of another shape or size is obviously intended to fall within the scope of the invention as claimed.

The device could be manufactured of various materials. Several which come immediately to mind are stainless-steel or other metals, plastic or wood. Each of these materials would have their own attractions in terms of the manufacture of the device. For example, stainless-steel or plastic could be sterilized easily. In some situations a wooden device may be preferable. It may be advantageous to manufacture this apparatus of such a material and in such a manner that could easily be sterilized between uses. In any event, it will be understood that other materials of manufacture than those specifically listed here are contemplated within the scope of the present invention as well.

The harvesting behavior of the device could be improved by sharpening the growth apertures 2, and the exposure apertures 5 where applicable. This might be done in one of two ways—firstly by sharpening the edges of the apertures, or in the alternative, the shape of the apertures might be changed in order to provide a more powerful harvesting motion. For example, in changing the shape of the apertures to sharpen them and increase the power of the harvesting motion, circular apertures might be used. A foreseeable alternative to round apertures would be to make the apertures of a shape with defined corners, such as a rectangle or triangle, and to orient the growth apertures 2 and the exposure apertures 5 on the growth surface 3 and the exposure plate 4 such that when the exposure plate 4 is moved against the growth surface 3 in the harvesting motion, the misalignment of the growth apertures 2 and the exposure apertures 5 causes a "closing diamond" shape, the sharp corners of which assist to shear off the mushroom bodies or other plant materials extending out from the substrate container 1 through the growth and exposure apertures 2, 5. While the shape of the growth apertures 2, and the exposure apertures 5, might be altered to improve the efficiency of the device it will be understood that the basic concept of the invention does not depend on the shape of these apertures and as such changes to the shape of the apertures are immaterial to the interpretation of the broadest claims that anpatent. It will also be understood, however, that any such changes to the shape of the apertures as might be obvious to one skilled in the art are contemplated within the scope of the present invention. Embodiments of the device also employing an internal growth surface 17 and/or a second cutting plate 19 could also be improved in this manner by sharpening the internal growth apertures 18 and the second exposure apertures 20.

In the case of mushrooms being grown in the device, the substrate which would be used in the substrate container would be any conventional mushroom growing substrate. Alternatively, if other plant material were being cultivated such as leafy herbs, cut flowers or the like, soil may in fact be the substrate used in the substrate container.

It will be understood that other shapes of the device of the present invention could also be manufactured without departing from the spirit and intention of the device and method claimed herein, and as such any other shapes which operate similarly are contemplated within the scope of the present invention.

In addition to being either horizontally oriented, as is demonstrated in the case of the flat embodiments of FIGS. 2 to 5, or vertically oriented as in the case of the columnar embodiment of FIG. 1, the device could also be oriented in a number of other directions. For example, it might be configured such that the growth surface was on angle up from the floor, or from the horizontal in any event and the exposure plate affixed thereupon. It will be understood that such orientations of the device are still contemplated within the scope of the present invention as well.

The present invention also comprises a novel method for the growth and cultivation and harvesting of mushrooms, in particular, as well as other plant material previously requiring labor-intensive or cost intensive growth and processing operations. This method of growing and harvesting plant material of the present invention comprises first placing a substrate in an apparatus for the growth and harvesting of plant material, said apparatus comprising a substrate container, said substrate container in turn including a growth surface through which extend a plurality of growth apertures arrayed in a pattern on the growth surface; and an exposure plate which is slidably mated to the growth surface, said exposure plate having a plurality of exposure apertures passing therethrough and arrayed thereon in a pattern matching the pattern of the growth apertures on the growth surface. The growth apertures and the exposure apertures are aligned such that the substrate contained within the substrate container is accessible from outside of the exposure plate, and that plants growing in the substrate can grow through the growth surface and the exposure plate via the mated growth apertures and exposure apertures.

The apparatus having been prepared, the next step in the method of the present invention is to plant or inoculated plant material in the substrate within the substrate container such that the plants when they germinate will grow out of the substrate container through the mated growth apertures and exposure apertures.

The plant material having been planted in the apparatus, the plant material is then allowed to grow to the desired stage.

Once the plant material has grown to the desired stage, the plant material is harvested by sliding the exposure plate along the growth surface, thus misaligning the growth apertures and exposure apertures and in the process shearing off the plant material.

As discussed in more detail with respect to the various preferred embodiments of the device of the present invention above, the apparatus of the method of the present invention might also be changed or improved by the addition of a volume-reducing core to the substrate container. This would lessen the volume of substrate wasted and/or expended in the growth of batches of plant material in the device. Furthermore, again, such a volume-reducing core could be further improved by converting it into an internal growth surface through which a second batch of plant material could be cultivated in the device at the same time through a set of internal growth apertures opening towards the center of the substrate container. A second exposure plate can also be added to further simplify the harvesting of plant material from the internal growth surface, as well as optionally to provide for the selective exposure of only certain sets of the internal growth apertures at any one time.

The present invention also contemplates a method of cultivation and harvesting of plant material employing a cutting embodiment of an apparatus similar to the one above, and as outlined in more detail with respect to the preferred embodiments of the device discussed above. Again, such cutting embodiments could also be further improved by the addition of a volume-reducing core to the substrate container which would reduce the amount of substrate required. Also again, the core could be converted into an internal growth surface by placing a number of internal growth apertures thereon. A second cutting plate could be employed to harvest plant material growing on the internal growth surface.

Thus it can be seen that the invention accomplishes all of its stated objectives. The foregoing is considered as illustrative only of the principles of the invention. Further, since numerous changes and modifications will readily occur to those skilled in the art, it is not desired to limit the invention to the exact construction and operation shown and described, and accordingly, all such suitable changes or modifications in structure or operation which may be resorted to are intended to fall within the scope of the claimed invention.

We claim:

1. An apparatus for use in the growth and harvesting of plant material, wherein said plant material is grown in a substrate before harvesting, said apparatus comprising substantially a substrate container, said substrate container including a growth surface through which extend a plurality of growth apertures arrayed in a pattern on the growth surface, and an exposure plate which is slidably mated to the growth surface, said exposure plate having a plurality of exposure apertures passing therethrough and arrayed thereon in a pattern such that the exposure apertures align with a portion of the growth apertures; wherein sliding the exposure plate with respect to the growth surface shears off the plant material by the misalignment of the mated growth apertures and exposure apertures.

2. The apparatus of claim 1 wherein all growth apertures are aligned with a matching exposure aperture at the same time.

3. The apparatus of claim 1 wherein only a portion of said growth apertures are aligned with a matching exposure aperture at the same time, the remaining growth apertures being covered by said exposure plate.

4. The apparatus of claim 1 wherein the edges of said apertures are sharpened to facilitate said shearing off of plant material.

5. The apparatus of claim 1 further comprising mechanical means for moving said exposure plate relative to said growth surface.

6. The apparatus of claim 1 further comprising a volume-reducing core inside of the substrate container.

7. The apparatus of claim 6 wherein the volume-reducing core is hollow and forms an internal growth surface through which extend a plurality of internal growth apertures arrayed in a pattern on the internal growth surface.

8. The apparatus of claim 7 further comprising a second exposure plate which is slidably mated to the internal growth surface, said second exposure plate having a plurality of second exposure apertures passing therethrough and arrayed thereon in a pattern such that the second exposure apertures align with a portion of the internal growth apertures; wherein sliding the second exposure plate with respect to the internal growth surface shears off the plant material growing therethrough by the misalignment of the mated internal growth apertures and second exposure apertures.

9. The apparatus of claim 8 wherein all internal growth apertures are aligned with a matching second exposure aperture at the same time.

10. The apparatus of claim 8 wherein only a portion of said internal growth apertures are aligned with a matching second exposure aperture at the same time, the remaining internal growth apertures being covered by said second exposure plate.

11. The apparatus of claim 8 wherein the edges of said apertures are sharpened to facilitate said shearing off of plant material.

12. The apparatus of claim 8 further comprising mechanical means for moving said second exposure plate relative to said internal growth surface.

13. An apparatus for use in the growth and harvesting of plant material, wherein said plant material is grown in a substrate before harvesting, said apparatus comprising substantially:

a substrate container, said substrate container including a growth surface through which extend a plurality of growth apertures arrayed in a pattern on the growth surface; and a cutting plate which is slidably mated to the growth surface;

wherein sliding said cutting plate relative to said growth surface cuts off said plant material growing through said growth apertures.

14. The apparatus of claim 13 further comprising means of mechanically moving the cutting plate in relation to the growth surface.

15. The apparatus of claim 13 further comprising a volume-reducing core inside of the substrate container.

16. The apparatus of claim 15 wherein the volume-reducing core is hollow and forms an internal growth surface through which extend a plurality of internal growth apertures arrayed in a pattern on the internal growth surface.

17. The apparatus of claim 16 further comprising a second cutting plate which is slidably mated to the internal growth surface, wherein sliding the second cutting plate with respect to the internal growth surface shears off the plant material growing through the internal growth apertures.

18. The apparatus of claim 17 further comprising mechanical means for moving said second cutting plate relative to said internal growth surface.

* * * * *